(12) United States Patent
Prakash et al.

(10) Patent No.: US 8,644,447 B2
(45) Date of Patent: Feb. 4, 2014

(54) SYSTEM AND A METHOD FOR GENERATING TIME BASES IN LOW POWER DOMAIN

(75) Inventors: Chandra Bhushan Prakash, Uttar Pradesh (IN); Balwinder Singh Soni, Faridabad (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 12/625,585

(22) Filed: Nov. 25, 2009

(65) Prior Publication Data

US 2010/0128837 A1 May 27, 2010

(30) Foreign Application Priority Data

Nov. 26, 2008 (IN) .......................... 2681/DEL/2008

(51) Int. Cl.
*H03K 21/00* (2006.01)
(52) U.S. Cl.
USPC ................. 377/47; 377/28; 377/31; 377/107; 377/110
(58) Field of Classification Search
None
See application file for complete search history.

(56) References Cited

U.S. PATENT DOCUMENTS

| | | | | |
|---|---|---|---|---|
| 4,443,887 | A * | 4/1984 | Shiramizu | 377/110 |
| 4,545,063 | A * | 10/1985 | Kamimaru | 377/52 |
| 4,726,045 | A * | 2/1988 | Caspell et al. | 377/110 |
| 4,741,004 | A * | 4/1988 | Kane | 377/110 |
| 4,891,825 | A * | 1/1990 | Hansen | 377/52 |
| 5,373,542 | A * | 12/1994 | Sunouchi | 377/44 |
| 5,412,682 | A * | 5/1995 | Laudenslager et al. | 372/65 |
| 5,454,018 | A * | 9/1995 | Hopkins | 377/28 |
| 5,457,722 | A * | 10/1995 | Chahabadi | 377/47 |
| 5,526,391 | A * | 6/1996 | Shankar et al. | 377/47 |
| 5,835,551 | A * | 11/1998 | Kawarazaki | 377/20 |
| 5,880,644 | A * | 3/1999 | Schmidt et al. | 332/109 |
| 7,092,479 | B1 * | 8/2006 | Reid et al. | 377/28 |
| 2003/0202628 | A1 * | 10/2003 | Tester | 377/115 |

* cited by examiner

*Primary Examiner* — Tuan T Lam
(74) *Attorney, Agent, or Firm* — Wolf, Greenfield & Sacks, P.C.

(57) ABSTRACT

A digital frequency divider including a parallel output register, a presettable asynchronous counter and a decoder. The parallel output register contains a desired count value. The presettable asynchronous counter has its preset data inputs coupled to the output of the parallel output register. The decoder receives its input from the data outputs of the presettable asynchronous divider and its output coupled to the load input of the presettable asynchronous counter.

23 Claims, 10 Drawing Sheets

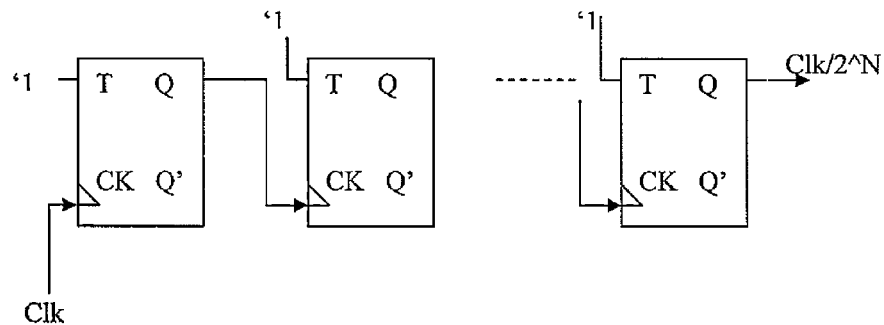
Fig 1.1
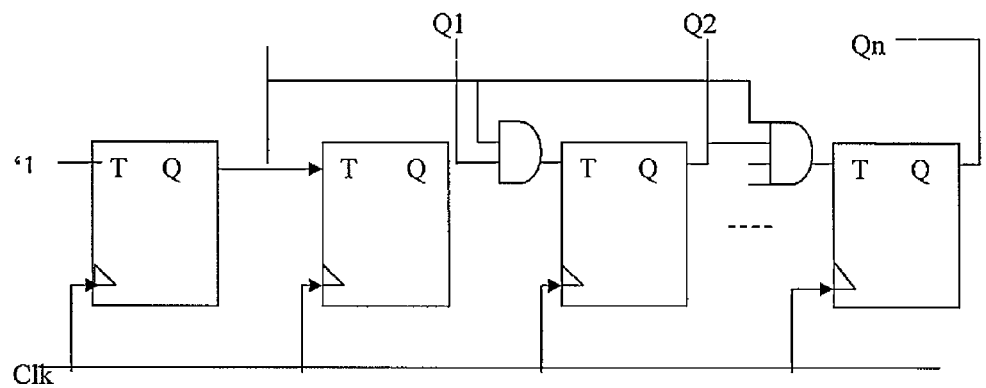
Fig 1.2
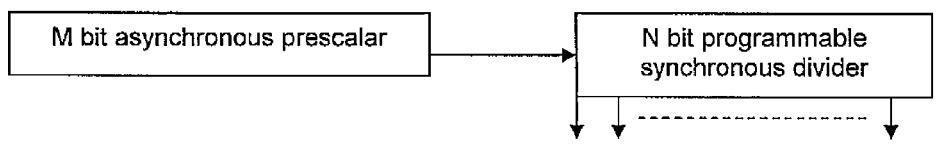
Fig 1.3

SYSTEM AND A METHOD FOR GENERATING TIME BASES IN LOW POWER DOMAIN

CROSS REFERENCE TO RELATED APPLICATIONS

This application claims the priority benefit of Indian patent application number 2681/Del/2008, filed on Nov. 26, 2008, entitled "A System And A Method For Generating Time Bases In Low Power Domain," which is hereby incorporated by reference to the maximum extent allowable by law.

BACKGROUND

1. Field of the Invention

The present disclosure relates to a system and a method for generating time bases in low power domain and more particularly relates to a programmable asynchronous divider which can generate divided clock output in any ratio of input clock.

2. Discussion of the Related Art

The current methodologies for time base generation include the well known Asynchronous divider, Synchronous divider and mixture of both.

Asynchronous divider is utilized when the design is aimed at extremely low power applications. In this approach the output of previous Flip-Flop acts as clock to the next stage as shown in FIG. 1.1. Hence dynamic power consumption decreases exponentially down the stage producing a 50% duty cycle clock output. In this case time bases in ratio of powers of 2 (clk/2, clk/4, clk/8 . . . ) with respect to original clock is achievable.

In synchronous divider clock is fed to all the Flip-Flops as shown in FIG. 1.2. The programmability of this divider is such that it leads to divided clock output in any ratio with respect to original clock. The Flip-Flops in the divider can be programmed with any value between 0 and $2^{n-1}$ and hence by decoding $Q_0$ through $Q_n$ any ratio divided clock can be achieved. However this divider consumes high power and has large gate count.

Synchronous Divider with Asynchronous Prescalar as shown in FIG. 1.3 is often used in low power domain as optimal solution of above two approaches. The asynchronous divider is used as prescalar and programmable synchronous divider is clocked with the output of this prescalar. For an N bit prescalar, divided clock output from synchronous divider will be in multiples of $2^N$. e.g for 4 bit asynchronous prescalar, synchronous divider can be programmed to get divided clock output of clk/16, 2*clk/16, 3*Clk/16 . . . m*clk/16.

BRIEF DESCRIPTION OF THE DRAWINGS

The aforementioned aspects and other features of the present disclosure will be explained in the following description, taken in conjunction with the accompanying drawings, wherein:

FIG. 1.1 represents an asynchronous divider in accordance to prior art.

FIG. 1.2 represents a synchronous divider in accordance to prior art.

FIG. 1.3 represents a synchronous divider with asynchronous prescalar in accordance to prior art.

SUMMARY OF THE INVENTION

Embodiments of the present disclosure will be described in detail with reference to the accompanying drawings. However, the present disclosure is not limited to the embodiments and the embodiments described herein in the art of the present disclosure. The disclosure is described with reference to specific circuits, block diagrams, signals, etc. simply to provide a more thorough understanding of the disclosure.

An embodiment of the present disclosure teaches a digital frequency divider comprising a parallel output register, a presettable asynchronous counter and a decoder. The parallel output register containing a desired count value. The presettable asynchronous counter having its preset data inputs coupled to the output of said parallel output register. The decoder receives its input from the data outputs of said presettable asynchronous divider and its output coupled to the load input of said presettable asynchronous counter.

An embodiment of the present disclosure also teaches a method of dividing frequency. In the said method input clock pulses are counted asynchronously from a preset count. Said preset count value is loaded when count reaches a predetermined value. Then an output pulse is generated whenever said preset count is loaded.

An embodiment of the present disclosure further teaches a time base generator comprising a digital frequency divider. The digital frequency divider further comprises a parallel output register, a presettable asynchronous counter and a decoder. The parallel output register containing a desired count value. The presettable asynchronous counter having its preset data inputs coupled to the output of said parallel output register. The decoder receives its input from the data outputs of said presettable asynchronous divider and its output coupled to the load input of said presettable asynchronous counter.

DETAILED DESCRIPTION

Figure 2:
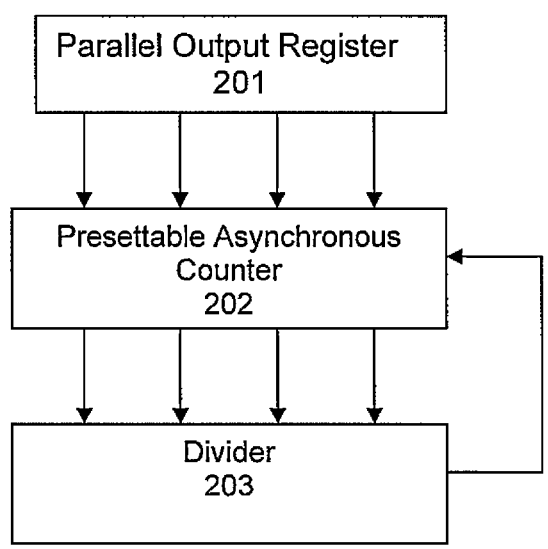
FIG. 2 illustrates a block diagram for generating time bases in accordance to an embodiment of the present disclosure.

FIG. 2 represents a digital frequency divider according to the present disclosure. The frequency divider comprises a parallel output register (201), a presettable asynchronous counter (202) and a decoder (203).

The parallel output register containing a desired count value. The presettable asynchronous counter having its preset data inputs coupled to the output of said parallel output register. The decoder receives its input from the data outputs of said presettable asynchronous divider and its output coupled to the load input of said presettable asynchronous counter. The presettable asynchronous counter includes a plurality of cascaded Flip-flops ($FF_1$, $FF_2$ . . . $FF_n$). The decoder includes a synchronizing element, which is a Flip-flop ($FF_0$).

Figure 3:
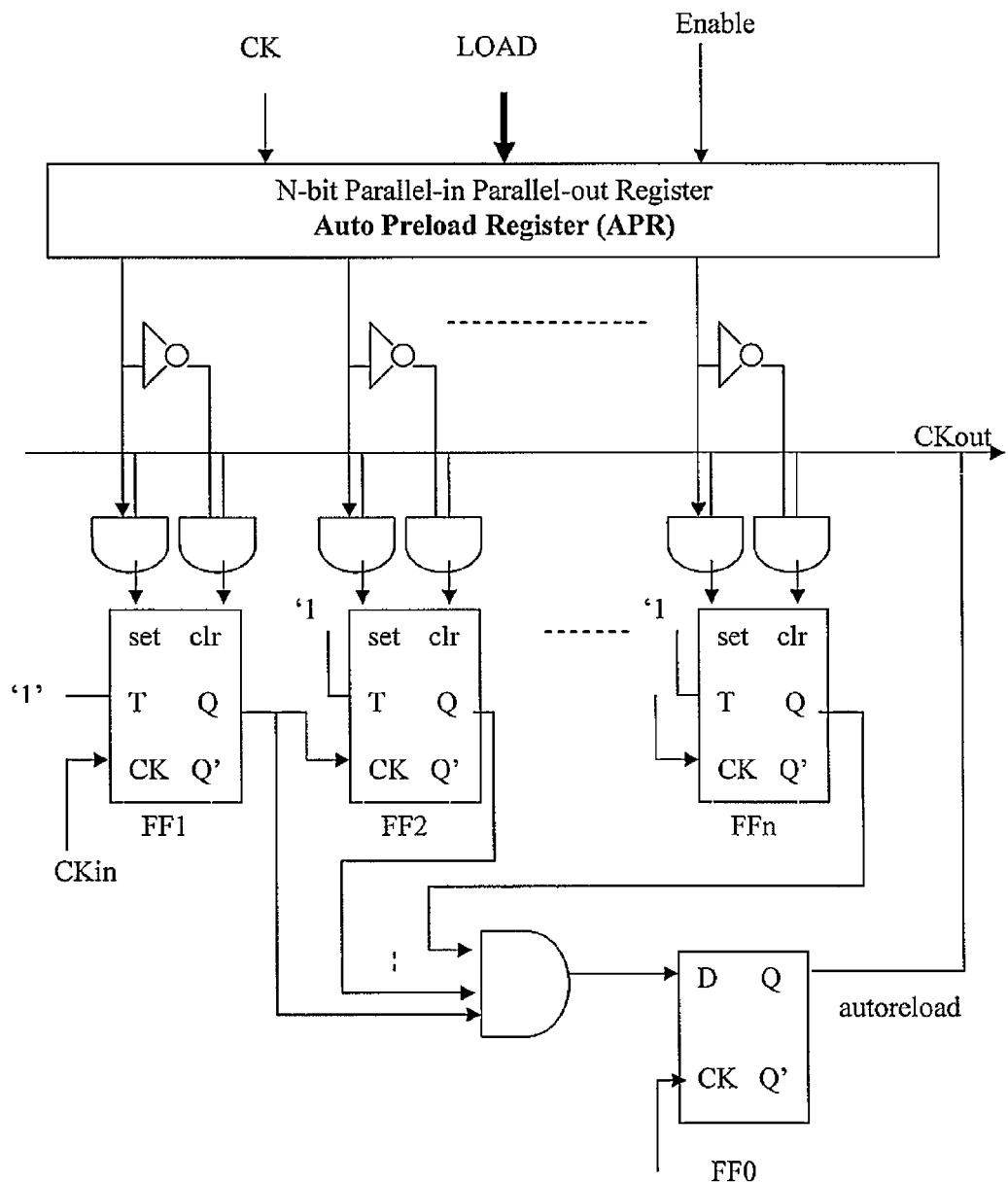
FIG. 3 illustrates a circuit diagram for generating time bases in accordance to an embodiment of the present disclosure.

An embodiment of the present disclosure is described in FIG. 3. The embodiment includes of an N-bit asynchronous divider stage comprising Flip-Flops $FF_1$ through $FF_n$. All the Flip-Flops in this divider are having set and reset inputs. The outputs from all the Flip-Flops are ANDed together and fed to Flip-Flop $FF_0$ to generate 'autoreload' signal or $CK_{out}$ signal. $FF_0$ avoids any spike occurring during decoding of $FF_1$ through $FF_n$. The 'autoreload' or $CK_{out}$ signal is generated for one $CK_{in}$ cycle whenever the divider reaches "111 . . . 11" and then it reloads the divider ($FF_1$ to $FF_n$) with its programmed value through Auto Preload Register (APR). The Set and Reset inputs of the Flip-Flops are used are asserted as active high for the reloading purpose. As soon as divider is reloaded, 'autoreload' or $CK_{out}$ signal goes low in the next $CK_{in}$ cycle which in turn releases the divider to continue down-counting from its reload value from the next $CK_{in}$ cycle. In this way we get programmable divided clock from $CK_{out}$, with $CK_{in}$ pulse width. The relation among frequency of input clock $f_{CKin}$, programmed value APR (n−1 downto 0) and frequency of output clock $f_{CKout}$ is:

$$f_{CKout} = f_{CKin}/(APR+3) \quad (1)$$

Table for this conversion is as follows:

| APR(n − 1 downto 0) | $f_{CKout}$ |
|---|---|
| 0 | $f_{CKin}/3$ |
| 1 | $f_{CKin}/4$ |
| 2 | $f_{CKin}/5$ |
| . | . |
| . | . |
| . | . |
| $2^{n-3}$ | $f_{CKin}/2^n$ |
| $2^{n-2y}$ | $f_{CKin}/(2^{n+1})$ |
| $2^{n-1}$ | Logic '1' will be the output |

It should be noted that as Auto Preload Register and the divider FFs are running on different clocks (CK and $CK_{in}$ respectively). Therefore, in low power applications frequency of $CK_{in}$ is always less than or equal to CK, and synchronization through handshakes is used for this purpose.

Figure 4:
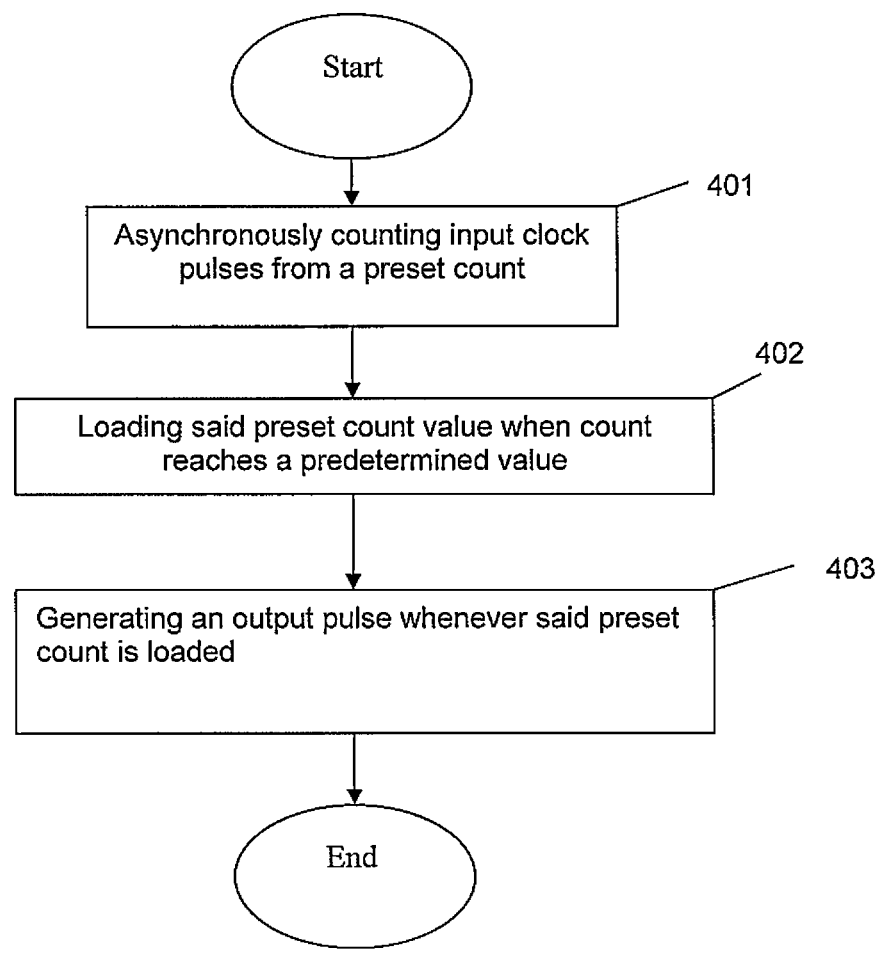
FIG. 4 illustrates a method for generating time bases in accordance to an embodiment of the present disclosure.

Embodiments of the method for optimizing consumption of electrical power are described in FIG. 4. The methods are illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 4 illustrates a method of dividing frequency in accordance to an embodiment of the present disclosure. In this method input clock pulses are counted asynchronously from a preset count in step 401. In step 402 said preset count value is loaded when count reaches a predetermined value. An output pulse is generated whenever said preset count is loaded in step 403.

Figure 5:
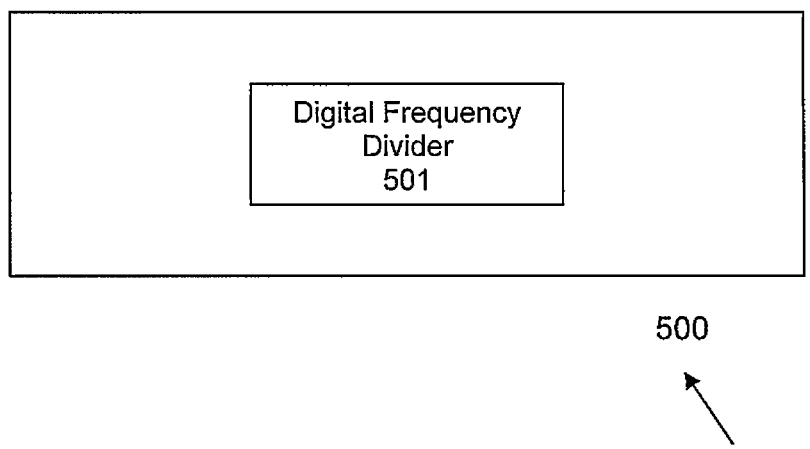
FIG. 5 illustrates a time base generator for generating time bases in accordance to an embodiment of the present disclosure.
Figure 6A:
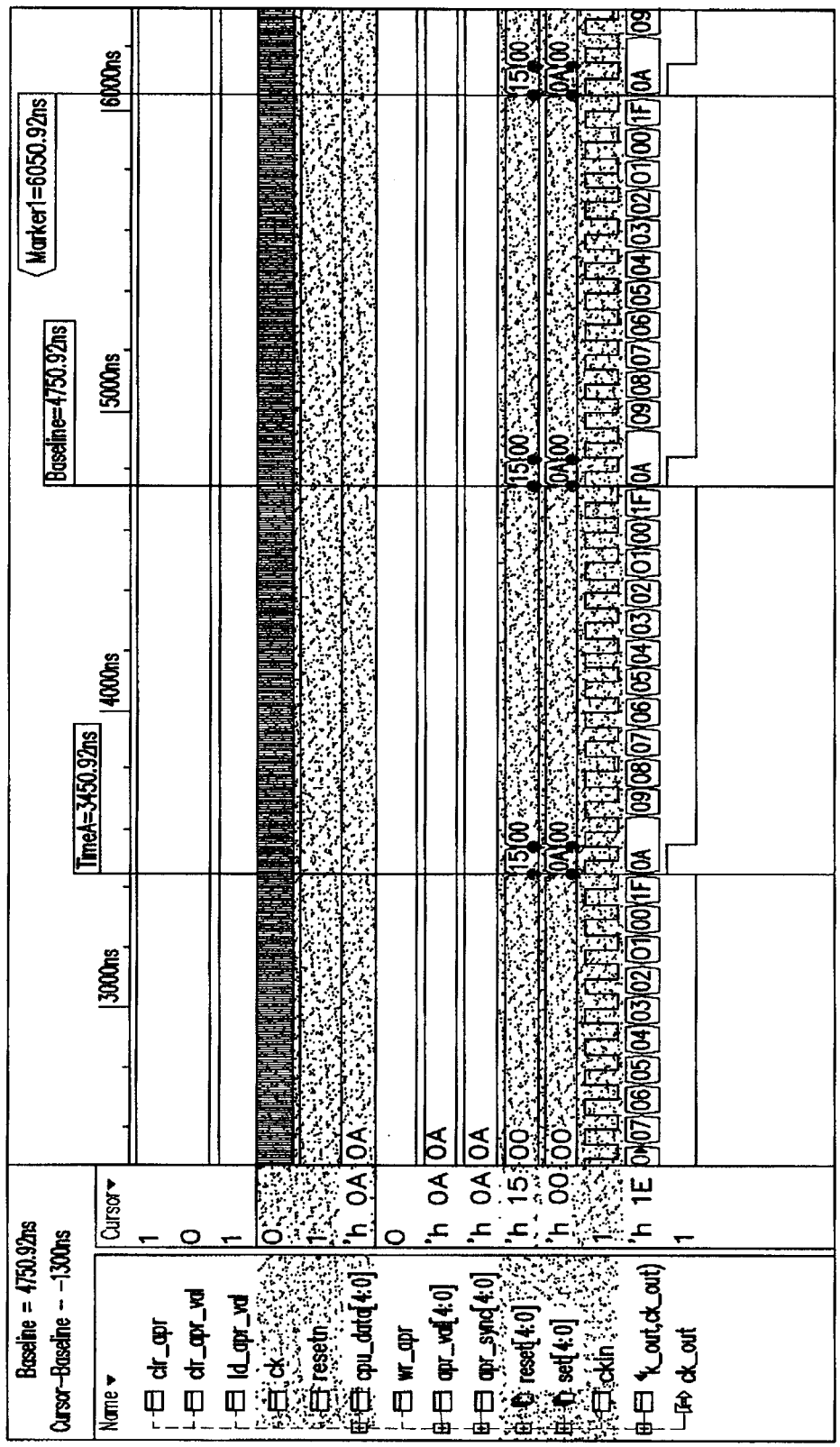
FIGS. 6a to 6e depict simulation results corresponding to FIG. 2.
Figure 6B:
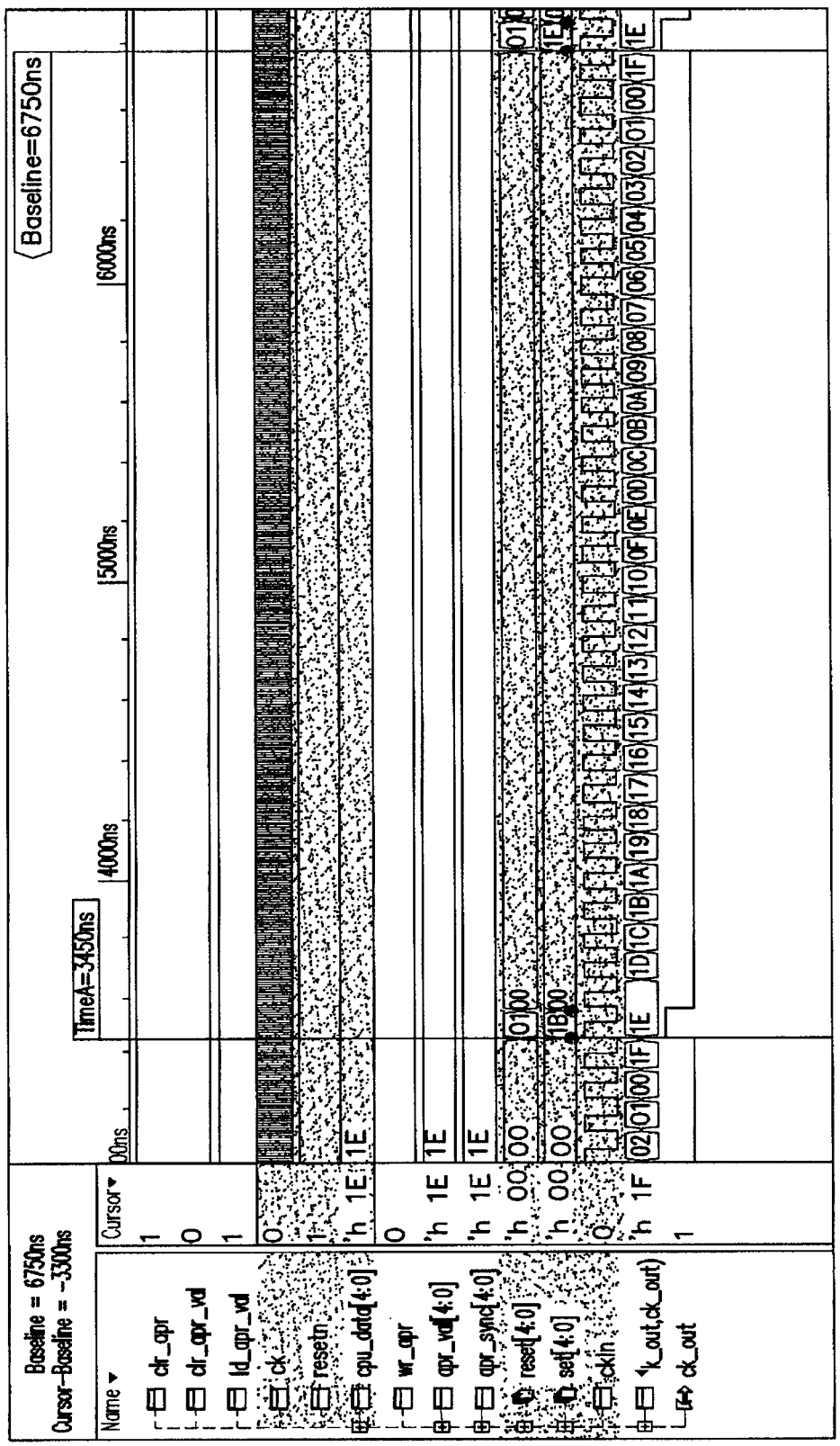
Figure 6C:
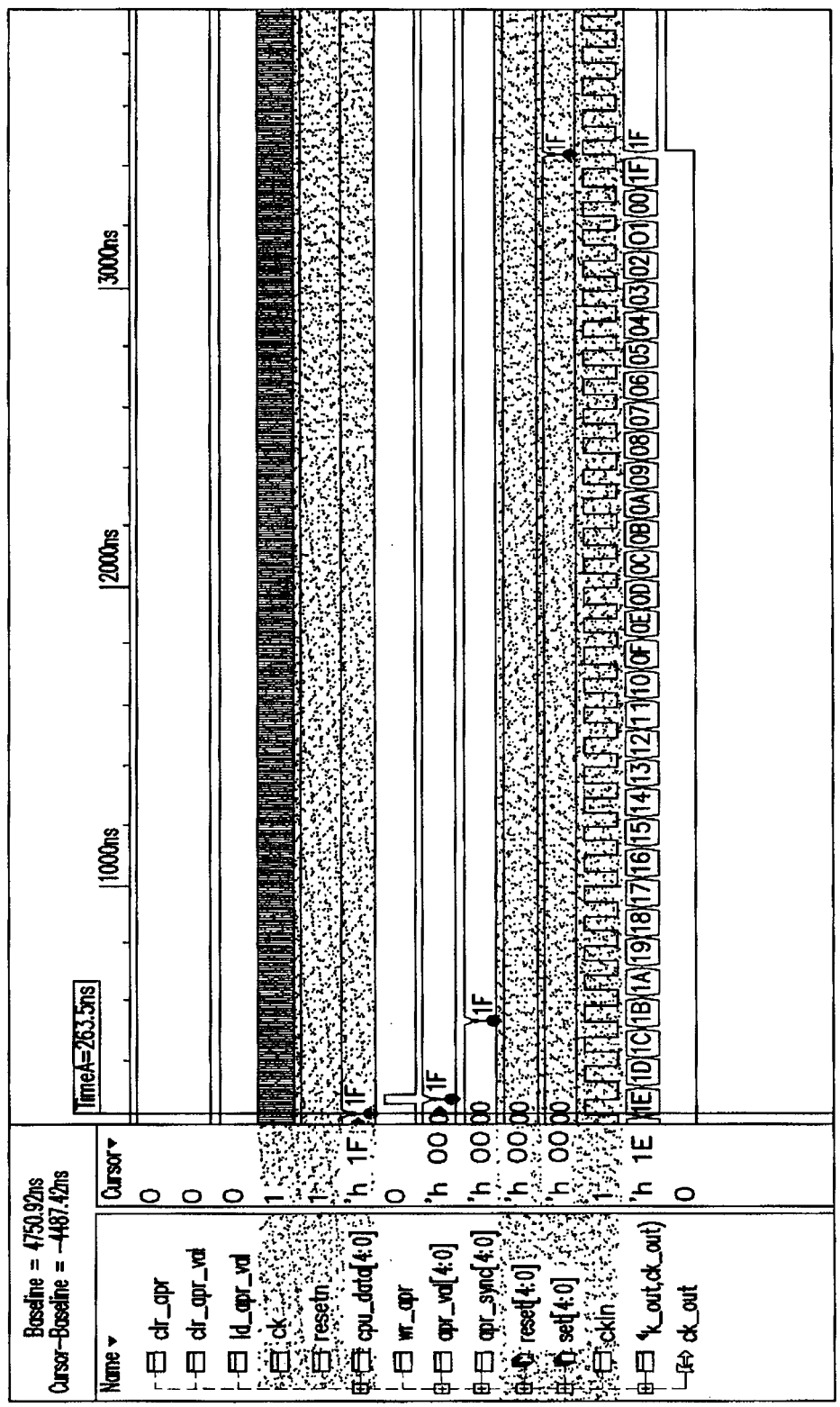
Figure 6D:
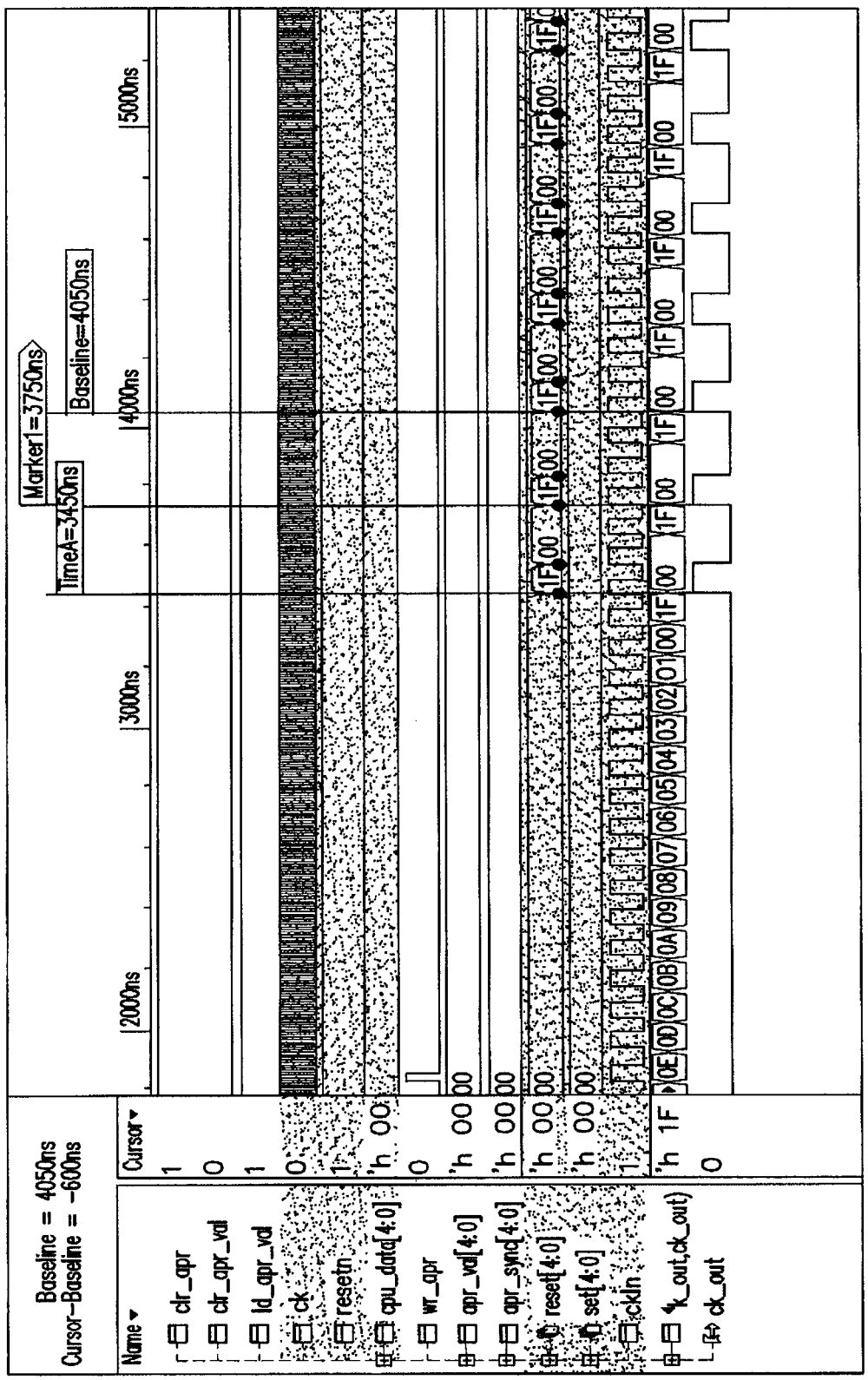
Figure 6E:
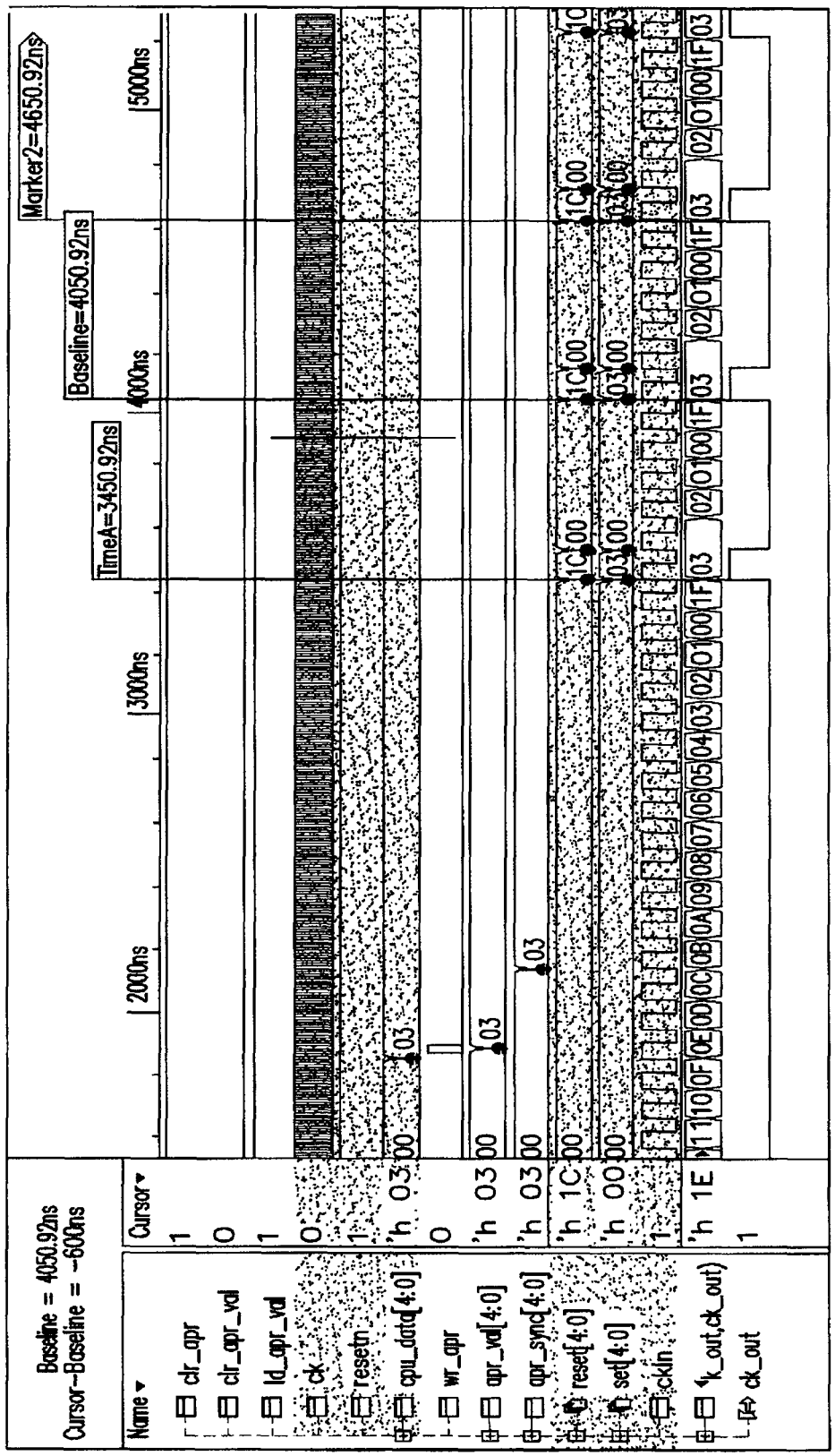

FIG. 5 represent a time base generator for generating time bases. The time base generator (500) comprises a digital frequency divider (501) for dividing frequency. The frequency divider comprises a parallel output register, a preset-table asynchronous counter and a decoder.

The process of writing Auto Preload Register (APR) is explained as follows:

```
reg_write: process(ck, nreset)
begin
    if ( nreset = '0') then
        apr_val <= (others => '0');
        ld_apr_val <= '0';
        clr_apr_val <= '0';
    elsif (ck'event and ck = '1') then
        if (wr_apr = '1') then
            apr_val <= cpu_data;
            ld_apr_val <= '1';
            clr_apr_val <= clr_apr;
        elsif (clr_apr_val = '1') then
            ld_apr_val <= '0';
        end if;
    end if;
end process;
```

The implementation of N=5 bit asynchronous divider with set reset input Flip-Flops is explained as follows:

```
gen_divby2: for i in 1 to 5 generate
    ck_in(i) <= count_reg(i-1);
    reset(i-1) <= not(apr_sync(i-1)) and autoreload;
    set(i-1) <= apr_sync(i-1) and autoreload;
    if (reset(i-1) = '1')then
        count_reg(i) <= '0';
    elsif (set(i-1) = '1')then
        count_reg(i) <= '1';
    elsif (ck_in(i)'event and ck_in(i) = '1') then
        count_reg(i) <= not count_reg(i);
    end if;
end generate;
count_reg(0) <= ckin;
```

The process of generating autoreload signal is explained as follows:

```
cnt_autoreload: process(ckin, nreset)
begin
    if ( nreset = '0') then
        autoreload <= '0';
    elsif ( ckin'event and ckin = '1') then
        autoreload <= and_reduce(count_reg(5 downto 1));
    end if;
end process;
ckout <= autoreload;
```

FIGS. 6a to 6e depict simulation results corresponding to FIG. 3. Simulation results of a 5 bit divider as implemented in the method and as described above are shown with different count value or 'apr_val'. The time period of CKin is 100 ns. Simulations 1 to 5 are represented by FIGS. 6a to 6d respectively.

From simulation 5 it is evident that after APR register ('apr_val') is written (i.e wr_apr is asserted), the value is transferred to the Flip-Flops in the divider whenever 'autoreload' signal goes high. This is again true when the count of the divider reaches 1 Fh. The same things, although not shown, occurs in other simulations too.

Simulations 1, 2, 4 and 5 verify equation (1). In simulation 1, (with apr_val=0 Ah) 'ck_out' is /13. In simulation 2 (with apr_val=1Eh) it is /33, in simulation 4 (with apr_val=00 h) 'ck_out' is /3 and in simulation 5 (with apr_val=03 h) 'ck_out' is /6.

Simulation 3 (with apr_val=1 Fh) will always have logic '1' as 'ck_out' because all the Flip Flops in divider will be in set state.

Although the disclosure of the instant disclosure has been described in connection with the embodiment of the present disclosure illustrated in the accompanying drawings, it is not limited thereto. It will be apparent to those skilled in the art that various substitutions, modifications and changes may be made thereto without departing from the scope and spirit of the disclosure.

What is claimed is:

1. A digital frequency divider comprising:
a parallel output register containing a desired count value representative of an even or odd number;
a presettable asynchronous counter having a clock input configured to receive an input clock signal, having data inputs coupled to the output of the parallel output register, and having a plurality of count outputs; and
a decoder comprising a single logical AND circuit configured to receive as input plural signals that are representative of plural count outputs of said presettable asynchronous counter and wherein the decoder includes an output coupled to a load input of said presettable asynchronous counter and wherein
the decoder comprising the single logical AND circuit is configured to output an output clock signal of a single frequency for both the even and odd numbers that is a frequency division of the input clock signal according to the desired count value and wherein a length of a pulse of the output clock signal is approximately one cycle of the input clock signal.

2. The digital frequency divider as claimed in claim 1, wherein said presettable asynchronous counter includes a plurality of cascaded Flip-flops.

3. The digital frequency divider as claimed in claim 1, wherein said decoder includes a synchronizing element.

4. The digital frequency divider as claimed in claim 3, wherein said synchronizing element is a synchronizing Flip-flop.

5. The digital frequency divider as claimed in claim 1, wherein the synchronizing element generates a clock signal to reload the presettable asynchronous counter.

6. The digital frequency divider as claimed in claim 5, wherein the clock signal is high when used to reload the presettable asynchronous counter, and wherein the clock signal becomes low after the presettable asynchronous counter is reloaded.

7. The digital frequency divider as claimed in claim 1, wherein the parallel output register is clocked by a first clock and the presettable asynchronous counter is clocked by a second clock different from the first clock.

8. The digital frequency divider as claimed in claim 7, wherein a frequency of the second clock is less than or equal to a frequency of the first clock.

9. The digital frequency divider as claimed in claim 1, wherein the parallel output register comprises a parallel-in parallel-out register.

10. The digital frequency divider as claimed in claim 1, wherein the decoder contains only a single flip-flop.

11. A method of dividing frequency comprising:
receiving, at a presettable asynchronous counter having a plurality of count outputs, an input clock signal;
asynchronously counting, via the presettable asynchronous counter, input clock pulses from a preset count value representative of an even or odd number;
determining, by a decoder, that a count value generated by the presettable asynchronous counter as a result of the asynchronous counting reaches a predetermined value, wherein the decoder comprises a single logical AND circuit configured to receive plural signals representative of plural count outputs of the presettable asynchronous counter;
providing an output of the decoder to the presettable asynchronous counter so that said preset count value is loaded to the presettable asynchronous counter when the count reaches the predetermined value; and
generating, by the decoder, an output clock signal of a single frequency for both the even and odd numbers that is a frequency division of the input clock signal and that comprises a pulse approximately one input clock cycle in length when said preset count value is loaded.

12. The method as claimed in claim 11, wherein said loading is performed after synchronization with a reference clock.

13. The method as claimed in claim 11, wherein said preset count value and said predetermined value is any desired value.

14. The method as claimed in claim 11, wherein the presettable asynchronous counter comprises cascaded flip flops.

15. The method as claimed in claim 11, further comprising loading the preset count from a parallel output register.

16. A time base generator comprising a digital frequency divider, said frequency divider comprising:
a parallel output register configured to receive a desired count value representative of an even or odd number;
a presettable asynchronous counter having a clock input configured to receive an input clock signal, having data inputs coupled to an output of said parallel output register, and having a plurality of count outputs; and
a decoder comprising a single logical AND circuit configured to receive plural signals representative of plural count outputs of said presettable asynchronous counter and having an output coupled to a load input of said presettable asynchronous counter, wherein the decoder is configured to output an output clock signal of a single frequency for both the even and odd numbers that is a frequency division of the input clock signal according to the desired count value and wherein a length of a pulse of the output clock signal is approximately one cycle of the input clock signal.

17. The digital frequency divider as claimed in claim 16, wherein said presettable asynchronous counter includes a plurality of cascaded Flip-flops.

18. The digital frequency divider as claimed in claim 16, wherein said decoder includes a synchronizing element.

19. The digital frequency divider as claimed in claim 18, wherein said synchronizing element is a synchronizing Flip-flop.

20. The digital frequency divider as claimed in claim 16, wherein the parallel output register comprises a parallel-in parallel-out register.

21. The digital frequency divider as claimed in claim 18, wherein the synchronizing element is a single clocked flip-flop.

22. The digital frequency divider as claimed in claim 21, wherein a reference clock signal is provided to the single clocked flip-flop and the parallel output register.

23. The time base generator of claim 16, wherein the decoder consists of the single logical AND circuit and a single flip-flop.

* * * * *